(12) United States Patent
Byun et al.

(10) Patent No.: US 6,371,716 B1
(45) Date of Patent: Apr. 16, 2002

(54) APPARATUS AND METHOD FOR UNLOADING SUBSTRATES

(75) Inventors: Sung-Joon Byun; Jong-Beom An; Sung-Cue Choi, all of Choongcheongnam-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/460,724

(22) Filed: Dec. 14, 1999

(30) Foreign Application Priority Data

Dec. 16, 1998 (KR) .............................. 98-55270

(51) Int. Cl.[7] .................... B65G 49/06; B65G 49/07
(52) U.S. Cl. .................... 414/416.03; 414/226.04; 414/226.05; 414/416.11; 414/936
(58) Field of Search .................... 414/796.4, 416.03, 414/416.11, 226.04, 226.05, 936

(56) References Cited

U.S. PATENT DOCUMENTS

| 4,633,584 A | * | 1/1987 | Wright et al. .................. 29/834 |
| 5,454,170 A | * | 10/1995 | Cook .......................... 33/645 |
| 5,636,960 A | * | 6/1997 | Hiroki ............... 414/416.03 X |

FOREIGN PATENT DOCUMENTS

| DE | 4304301 | * | 8/1994 |
| JP | 642946 | * | 1/1989 | .............. 414/796.4 |

* cited by examiner

Primary Examiner—Steven A. Bratlie
(74) Attorney, Agent, or Firm—McGuireWoods LLP (57) ABSTRACT

Disclosed is an apparatus for unloading substrates. The apparatus includes a handling station, a conveying robot, and a process apparatus controller. The handling station arranges substrates having different sizes and processed by a prior process apparatus. The conveying robot lifts the substrate arranged on the handling station and loads the substrate to a predetermined position on a cassette or a subsequent process apparatus. The process apparatus controller controls the arrangement of the substrate or motions of the conveying robot so that the substrate is loaded on the predetermined position of the cassette or the subsequent process apparatus. The unloading apparatus according to the present invention adjusts the position on which the substrate is placed in the handling station according to the size of the substrate or adjusts a rotational arc of the conveying robot so that the substrate is loaded to a secure position on the cassette or subsequent process apparatus.

12 Claims, 10 Drawing Sheets

APPARATUS AND METHOD FOR UNLOADING SUBSTRATES

BACKGROUND OF THE INVENTION (a) Field of the Invention

The present invention relates to an apparatus and a method for unloading substrates. More specifically, the present invention relates to an apparatus and a method for unloading thin film transistor liquid crystal display (TFT-LCD) substrates having different sizes.

(b) Description of the Related Art

A TFT-LCD applies an electric field to liquid crystal material having anisotropic dielectricity and injected between two substrates. The intensity of the electric field controls the amounts of light that permeates through the substrates to obtain desired images.

One of the two substrates of the TFT-LCD is a TFT substrate on which a plurality of pixel electrodes and thin film transistors are formed. The other substrate is a color filter (CF) substrate on which red, green, and blue color filters, for displaying desired colors, and a black matrix are formed.

Today's TFT-LCD manufacturing process forms a plurality of cells on a single master glass substrate. Each cell is cut to produce a TFT substrate or a CF substrate for a TFT-LCD. A plurality of cells on a master glass substrate enhance productivity. After forming a plurality of cells (e.g., 4, 6, or 8 cells) each of the master glass TFT substrate and the master glass CF substrate and after assembling them, they are then cut into individual pairs of TFT and CF substrates, thereby manufacturing a plurality of TFT-LCDs.

However, defects may occur in the cells of each master glass substrate in the above manufacturing process. When one of the two substrates of the resulting TFT-LCD is normal and the other defective, the entire resulting TFT-LCD becomes defective, and must be discarded.

Therefore, in the conventional manufacturing methods, master glass TFT and CF substrates are cut, for example, into one-half or one-third pieces, and the cut master glass TFT substrate and master glass CF substrate are assembled according to the cell defect pattern. The paired master glass substrates then proceed to the subsequent manufacturing process and produce a TFT-LCD comprised of either two normal or two defective TFT and CF substrates.

However, the conventional methods of unloading uncut master glass substrates and master glass substrates cut to ½ and ⅓ sizes to a cassette or the other process apparatus, cause problems since the substrates are unloaded without considering the various substrate size.

Figure 1A:
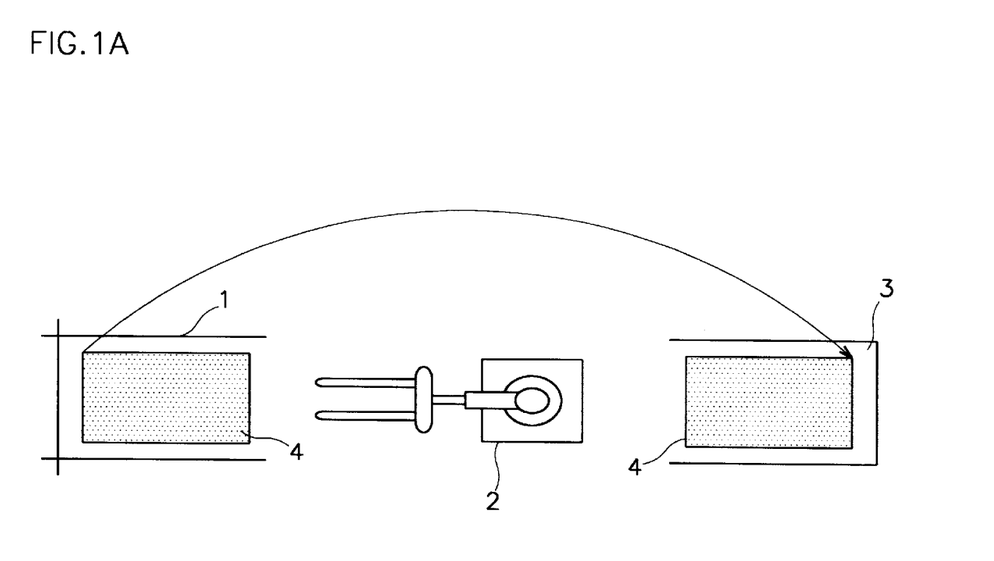
FIGS. 1(a) and (b) show a conventional method of unloading an uncut master substrate and a cut master substrate, respectively.

FIGS. 1(a) and (b) show a conventional method of unloading an uncut master substrate and a cut master substrate, respectively. Reference numeral 4 in FIG. 1(a) indicates the uncut master substrate and reference numeral 5 in FIG. 1(b) indicates the cut master substrate.

Figure 1B:
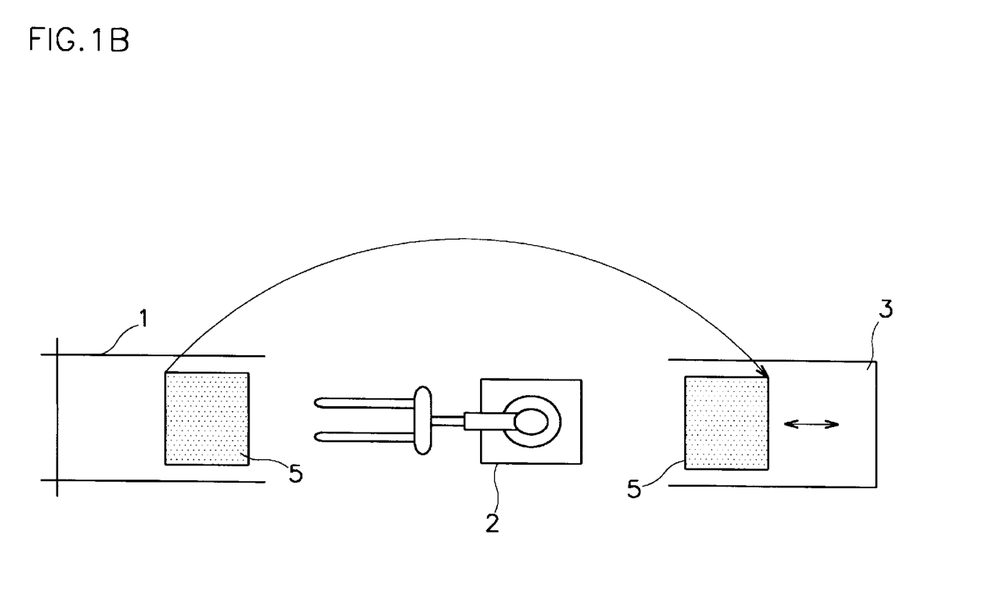

As shown in the drawings, the uncut master substrate 4 and the cut master substrate 5, on which predetermined processes have been performed in prior process apparatus, are placed on a handling station 1. At this time, the uncut master substrate 4 and the cut master substrate 5 are arranged at the front of the handling station 1. As shown in FIGS. 1(a) and (b), a conveying robot 2 lifts the uncut master substrate 4 and the cut master substrate 5 arranged at the front of the handling station 1, then moves them in the direction of the arrow to load on the cassette 3.

Such a conventional method moves the substrates 4 and 5 along a predetermined arc (based on inside edges of the substrates 4 and 5 closest to the conveying robot 2) without considering the size of the substrates 4 and 5. Therefore, although the uncut master substrate 4 is arranged to securely fit in the cassette 3, the cut master substrate 5 is loaded on the cassette 3 insecurely, because it is not placed adjacent to the closed side of the cassette 3. As a result, when transferring the cassette 3 loading the cut master substrate 5, vibrations or external shock can damage the substrate 5 because of the space between the outside edge of the substrate 5 and the closed side of the cassette 3. In other words, the substrate 5 can be damaged by moving toward the closed side of the cassette 3 and striking the walls.

SUMMARY OF THE INVENTION

It is an object of the present invention to provide an apparatus and method for unloading substrates that can place the substrates on a secure position of a cassette or a subsequent process apparatus by adjusting the position where the substrates are placed on a handling station or by adjusting a rotation radius of a conveying robot depending on a size of the substrates.

In order to achieve the object, the present invention provides an apparatus for unloading a substrate comprising a handling station arranging substrates having different sizes processed in prior process apparatus, a conveying robot lifting the substrate arranged on the handling station and loading the substrate to a predetermined position on a cassette or subsequent process apparatus regardless of a size of the substrate, and a process apparatus controller controlling the arrangement of the substrate on the handling station or the motions of the conveying robot in order to load the substrate on a predetermined position of the cassette or subsequent process apparatus regardless of the size of the substrate.

In order to load the substrates of different sizes on the predetermined secure position in a cassette or in a subsequent process apparatus, the system of the present invention either adjusts the length of the conveying robot's sliding arm or repositions the substrates on the handling station depending on their sizes.

Methods for unloading substrates according to the present invention are also provided.

BRIEF DESCRIPTION OF THE DRAWINGS

The accompanying drawings, which are incorporated in and constitute a part of the specification, illustrate an embodiment of the invention, and, together with the description, serve to explain the principles of the invention:

FIGS. 7(*a*) through (*c*) show a method for unloading a master substrate according to a third embodiment of the present invention.

DETAILED DESCRIPTION OF THE PREFERRED EMBODIMENTS

In the following detailed description, only the preferred embodiments of the invention have been shown and described, simply by way of illustrating the best mode contemplated by the inventors of carrying out the invention. As will be realized, the invention is capable of modification in various obvious respects, all without departing from the invention. Accordingly, the drawings and description are to be regarded as illustrative in nature, and not restrictive.

Figure 2:
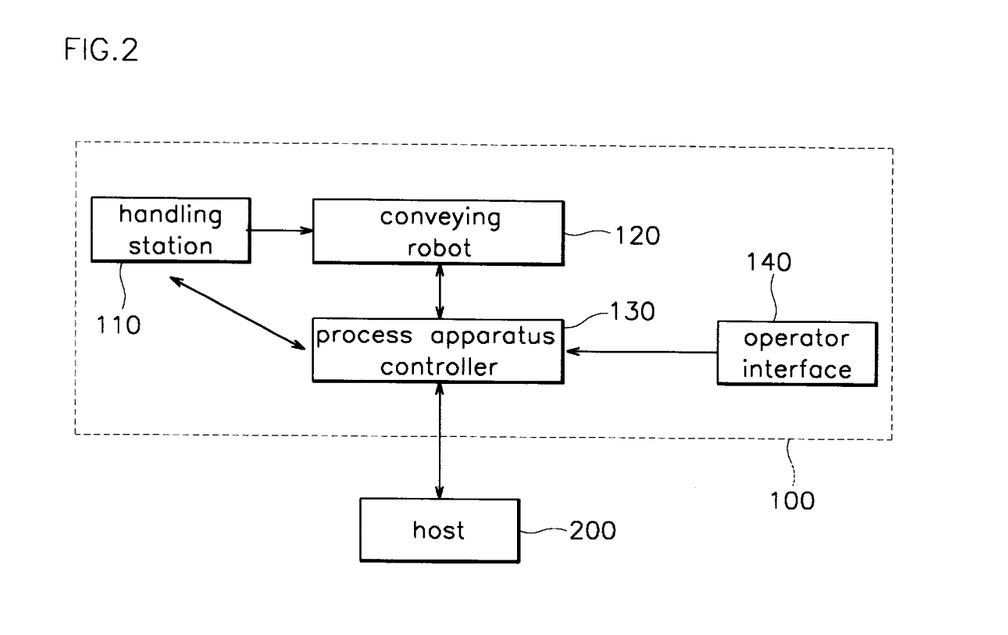
FIG. 2 is a block diagram of a substrate unloading device according to a preferred embodiment of the present invention.

FIG. 2 shows a block diagram of a substrate unloading device according to a preferred embodiment of the present invention. Reference numeral 100 in the drawing indicates the substrate unloading device.

As shown in the drawing, the substrate unloading device 100 comprises a handling station 110, a conveying robot 120, a process apparatus controller 130, and an operator interface 140.

Figure 3A:
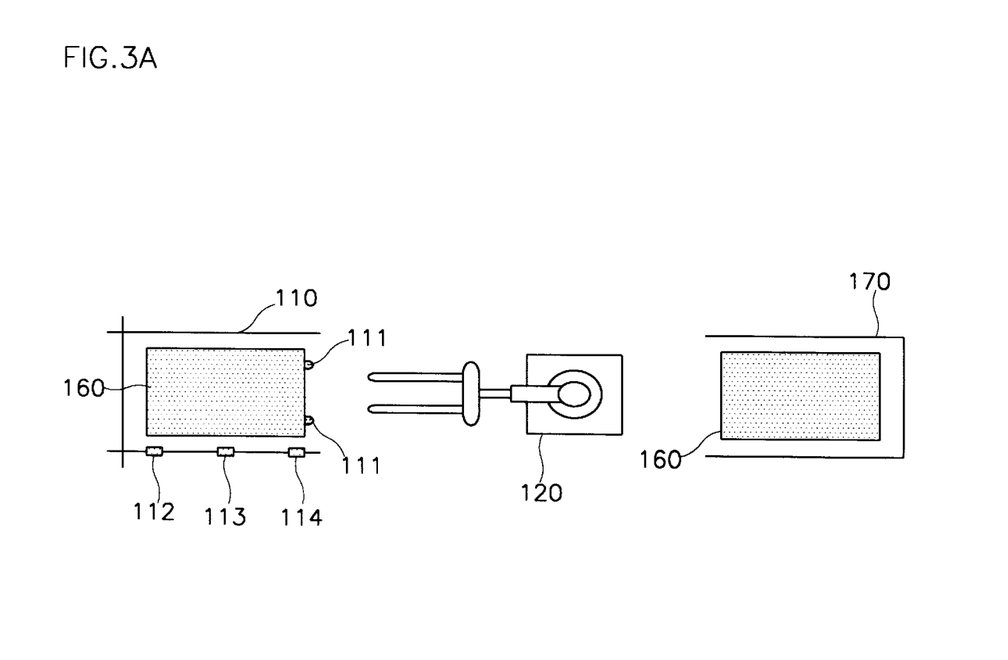
FIGS. 3(a) through (c) show a method for unloading a master substrate according to a first embodiment of the present invention.
Figure 3B:
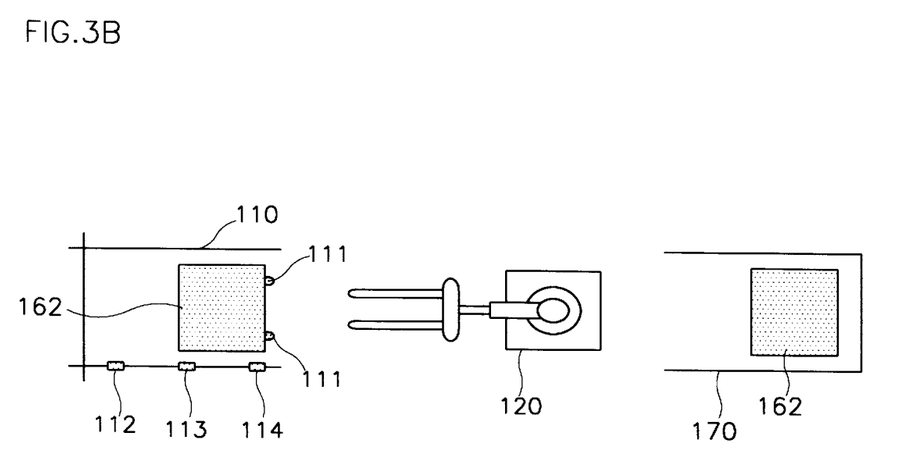
Figure 3C:
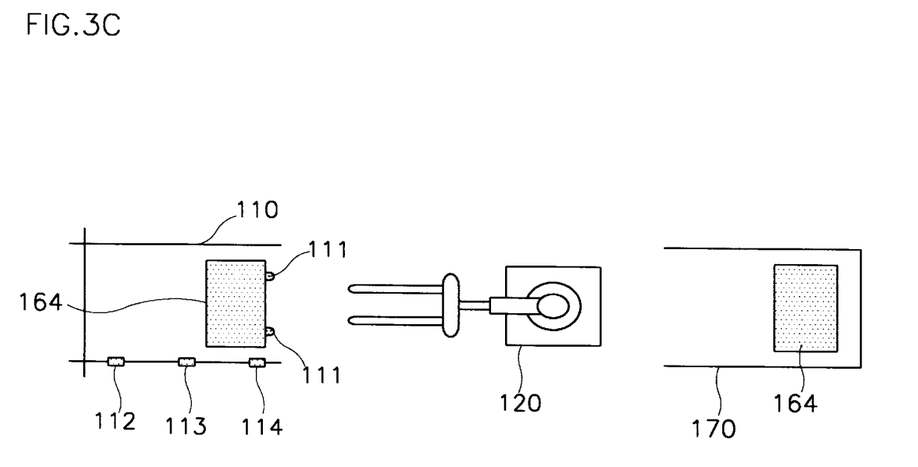

After predetermined jobs for a substrate have been performed in a prior process apparatus, the substrate is temporarily placed on the handling station 110 in order to unload the substrate. The handling station 110, as shown in FIGS. 3(*a*) through 3(*c*), comprises stop bars 111 and position detecting sensors 112, 113, and 114. The stop bars 111 arrange the substrate transferred from the prior process apparatus on the handling station 110. The substrate transferred from prior process apparatus is slid onto the handling station 110 until contacting the stop bars 111 at which the substrate stops its sliding motion to settle on the handling station 110. The position detecting sensors 112, 113, and 114 detect the size of the substrate placed on the handling station 110. A photo sensor is used for the position detecting sensors 112, 113, and 114 in the present invention.

The conveying robot 120 lifts the substrate arranged on the handling station 110 and moves the substrate for loading on a cassette or subsequent process apparatus. The substrate transferred by the conveying robot 120 is loaded on a secure position of the cassette or subsequent process apparatus regardless of the size of the substrate.

The process apparatus controller 130 controls the operations of the handling station 110 and the conveying robot 120 so that the substrate is loaded on a predetermined position of the cassette or the subsequent process apparatus regardless of the size of the substrate. In more detail, the process apparatus controller 130 controls the operations of the handling station 110 and the conveying robot 120 according to control commands provided by the operator through the operator interface 140, job commands from a host 200, or control programs stored in the process apparatus controller 130.

Referring to FIGS. 3(*a*) through (*c*), and FIGS. 4(*a*) through (*c*), a method for unloading the substrate will now be described according to a first embodiment of the present invention.

According to the first embodiment of the present invention, the substrate placed on the handling station 110 is arranged at the end the handling station 110 closest to the conveying robot 120 (hereinafter referred to as a front of the conveying robot 120) by the stop bars 111 as described above. This is realized regardless of the size of the substrate. At this time, the size of the substrate arranged on the handling station is detected by the position detecting sensors 112, 113, and 114.

As shown in FIG. 3(*a*), when an uncut master substrate 160 is arranged on the handling station 110 such that it contacts the stop bars 111, all of the three position detecting sensors 112, 113, and 114 detect the substrate 160. As shown in FIG. 3(*b*), when a substrate 162 cut to half the size of the uncut master substrate 160 (hereinafter referred to as a ½ cut master substrate) is arranged on the handling station 110 such that it contacts the stop bars 111, the position detecting sensors 113 and 114 may detect the substrate 162, but not the position detecting sensor 112. Similarly, as shown in FIG. 3(*c*), when a substrate 164 cut to one-third the size of the uncut master substrate 160 (hereinafter referred to as a ⅓ cut master substrate) is arranged on the handling station 110 such that it contacts the stop bars 111, the position detecting sensor 114 detects the substrate 164, but not the position detecting sensors 112 and 113.

Information on the size of the master substrate 160, 162 or 164 detected by the position detecting sensors 112, 113, and 114 of the handling station 110 is transferred to the process apparatus controller 130, and the process apparatus controller 130 controls a length of the conveying robot 120's arm based on this information.

Figure 4A:
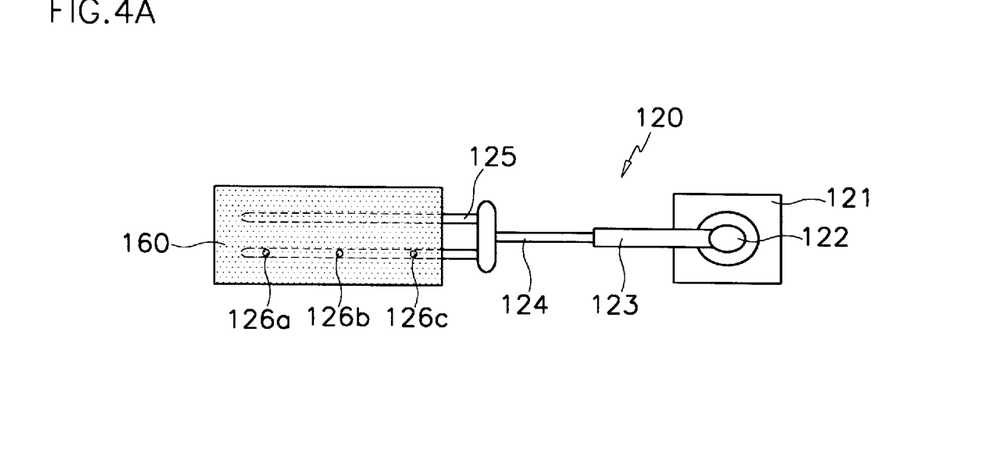
FIGS. 4(a) through (c) show moving status of a conveying robot for an uncut master substrate, a ½ cut master substrate, and a ⅓ cut master substrate, respectively.
Figure 4B:
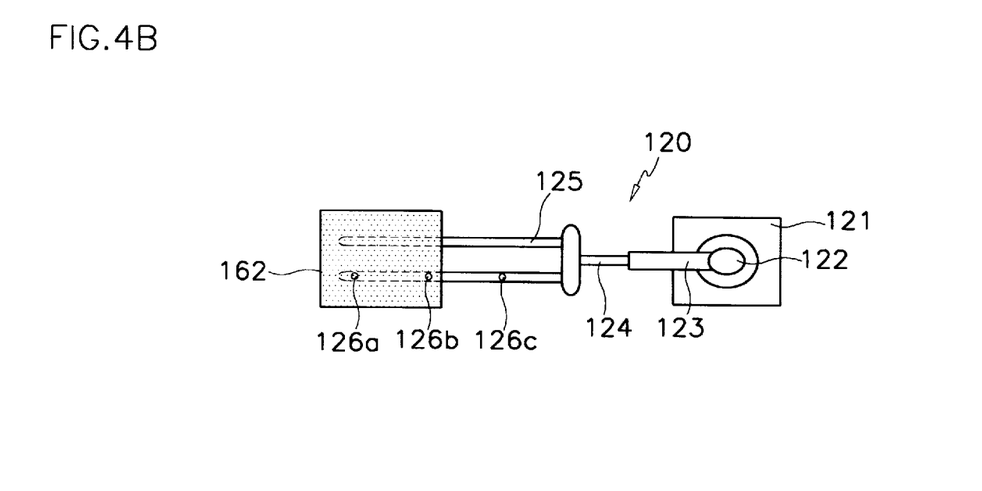
Figure 4C:
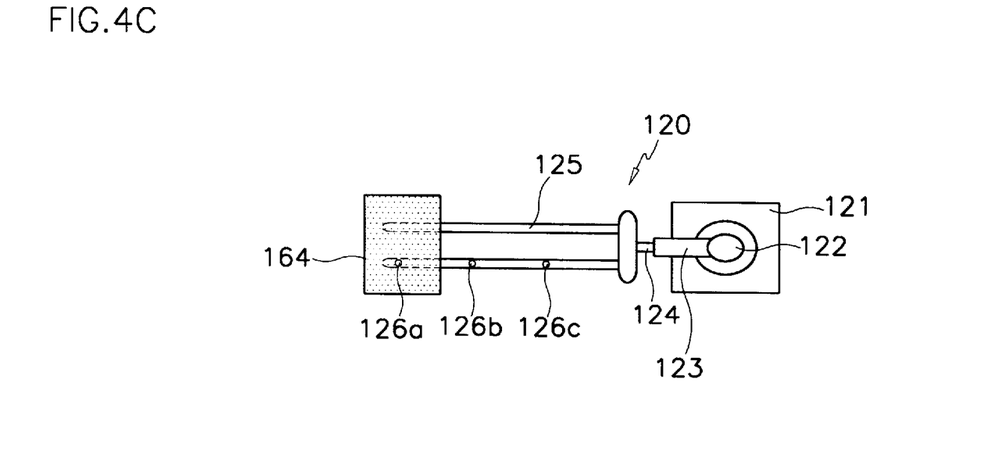

FIGS. 4(*a*) through (*c*) show moving status respectively of the conveying robot 120 for the uncut master substrate 160, the ½ cut master substrate 162, and the ⅓ cut master substrate 164 arranged on the handling station 110. As shown by FIGS. 4(*a*) through (*c*), in the first embodiment of the present invention, the conveying robot 120 comprises a base 121, a rotating shaft 122, a rotating arm 123, a sliding arm 124, and a conveying chuck 125. The rotating shaft 122 is formed on the base 121 so that the rotating shaft can be rotated. The rotating arm 123 is rotatably coupled to the rotation shaft 122. The sliding arm 124 is slidably coupled to the rotating arm 123. The length of the whole arm varies by sliding the sliding arm 124. The conveying chuck 125 has a vacuum suction plate (not shown), and conveys the master substrate 160, 162, or 164 holding them tightly by the vacuum suction plate.

According to the first embodiment of the present invention, the conveying robot 120 transfers the master substrate 160, 162, or 164 to a cassette or other process apparatus. At this time, when the conveying robot 120 lifts the uncut master substrate 160, the length of the conveying robot 120 does not change. However, when the conveying robot 120 lifts the ½ cut master substrate 162 or the ⅓ cut master substrate 164, the conveying robot 120 shortens as shown in FIGS. 4(*b*) and 4(*c*) by withdrawing the sliding arm 124 such that distal ends of the conveying chuck 125 are always under the cut master substrate 162 or 164. Next, after rotating the rotating arm 123 to move the cut master substrate 162 or 164 to a cassette or other process apparatus, the sliding arm 124 extends to increase the length of the conveying robot 120. As a result, the cut master substrates 162 and 164 are loaded on a secure, rearward part of the cassette (farthest from the conveying robot 120) respectively as shown in FIGS. 3(*b*) and 3(*c*).

In the first embodiment of the present invention, the sliding arm 124 is controlled by the process apparatus controller 130. That is, using the information on the size of the master substrate 160, 162, or 164 received from the handling station 110 as described above, the process apparatus controller 130 controls the length of the sliding arm 124 of the conveying robot 120.

The size of the master substrates 160, 162, and 164 is detected by the position detecting sensors 112, 113, and 114 on the handling station 110. However, when the conveying chuck 125 of the conveying robot 120 has detecting sensors 126a, 126b, and 126c, as shown in FIGS. 4(a) through (c), they can measure the size of the master substrates 160, 162, and 164.

The length of the arm of the conveying robot 120 can also be controlled by either receiving information on the size of the master substrates 160, 162, and 164 from the prior process apparatus or the host 200, or from the operator. When the operator provides the size information of the master substrates 160, 162, and 164, he or she visually checks the master substrate size, and then transmits this information to the process apparatus controller 130 through the operator interface 140.

Referring to FIGS. 5(a) through (c) and FIGS. 6(a) through (c), a method for unloading a master substrate according to a second embodiment of the present invention will now be described.

Figure 5A:
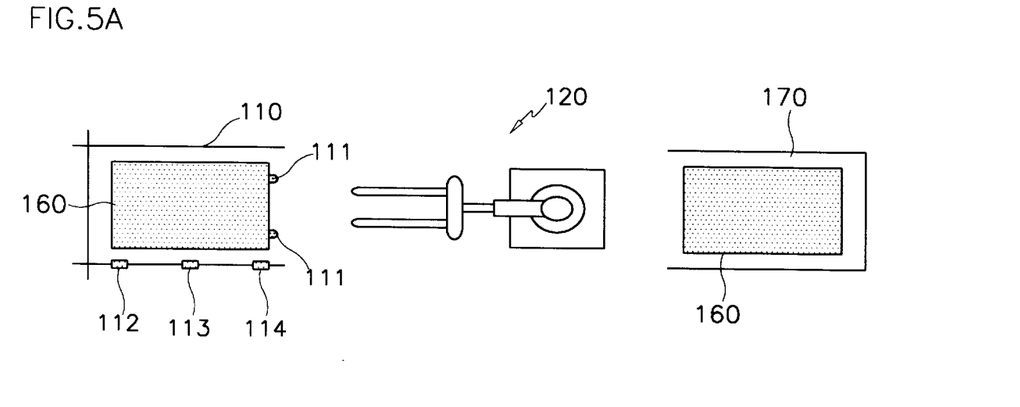
FIGS. 5(a) through (c) show a method for unloading a master substrate according to a second embodiment of the present invention.
Figure 5B:
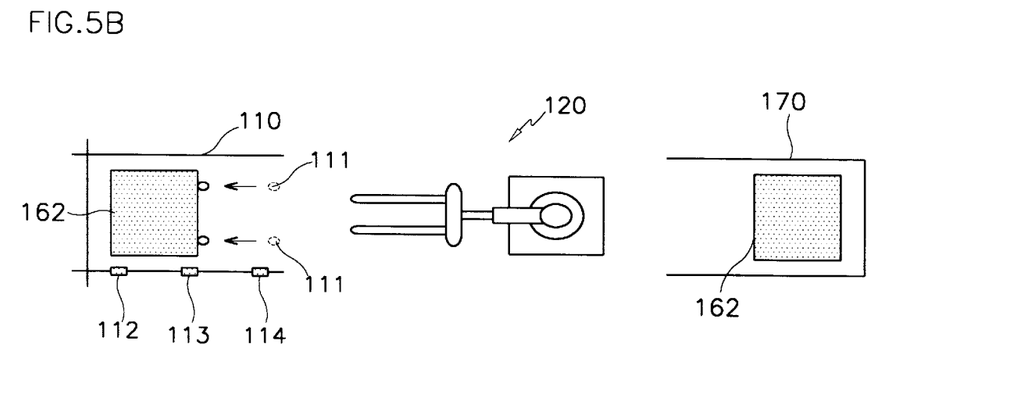
Figure 5C:
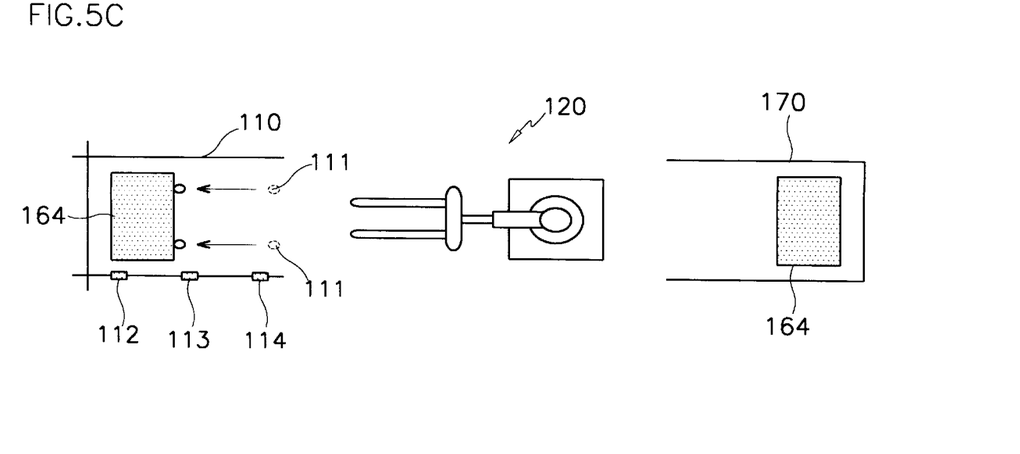

As shown in FIGS. 5(a) through (c), the substrate 160, 162, or 164 placed on the handling station 110 is arranged at the end of the handling station 110 farthest from the conveying robot 120 (hereinafter referred to as a rear of the handling station 110) by the stop bars 111. The process apparatus controller 130 moves the stop bars 11 depending on the size of the master substrate 160, 162, or 164 to arrange the substrates at the rear of the handling station 110.

The ½ cut master substrate 162 and ⅓ cut master substrate 164 are arranged at the rear of the handling station 110 through the following methods.

In a first method, the stop bars 111 are placed at the front of the handling station 110, and the uncut master substrate 160, ½ cut master substrate 162, and ⅓ cut master substrate 164 are slid onto the handling station 110 until they contact the stop bars 111. At this time, the position detecting sensors 112, 113, and 114 of the handling station 110 detect the size of each the substrate arranged by the stop bars 111, and transfer the detection results to the process apparatus controller 130. The process apparatus controller 130 moves the stop bars 111 toward the rear of the handling station 110 if it is detected that the ½ cut master substrate 162 or the ⅓ cut master substrate 164 has been transferred, thereby arranging all the substrates 160, 162, and 164 to the rear of the handling station 110. In other words, when the ½ cut master substrate 162, the stop bars 111 moves it toward the rear of the handling station 110 by a half of the length of the uncut master substrate 160. And in case of the ⅓ cut master substrate 164, the stop bars 111 moves it toward the rear of the handling station 110 by two-thirds of the length of the uncut master substrate 160. As a result, all the master substrates 160, 162, and 164 are arranged along the rear of the handling station 110 regardless of their sizes.

In a second method, the process apparatus controller 130 receives information on the size of the master substrate 160, 162, or 164 from the prior process apparatus or the host 200, or from the operator who manually inputs the information via the operator interface 140. After receiving this information, the process apparatus controller 130 moves the stop bars 111 before the master substrate 160, 162, or 164 is transferred into the handling station 110. That is, when the process apparatus controller 130 receives information that a ½ cut or ⅓ cut master substrate will move into the handling station 110, the process apparatus controller 130 moves the stop bars 111 to the position corresponding to the size of the substrate 162 or 164 as described above in the first method.

Therefore, as shown in FIGS. 5(a) through (c), the substrate is arranged along the rear of the handling station 110 regardless of its size.

Figure 6A:
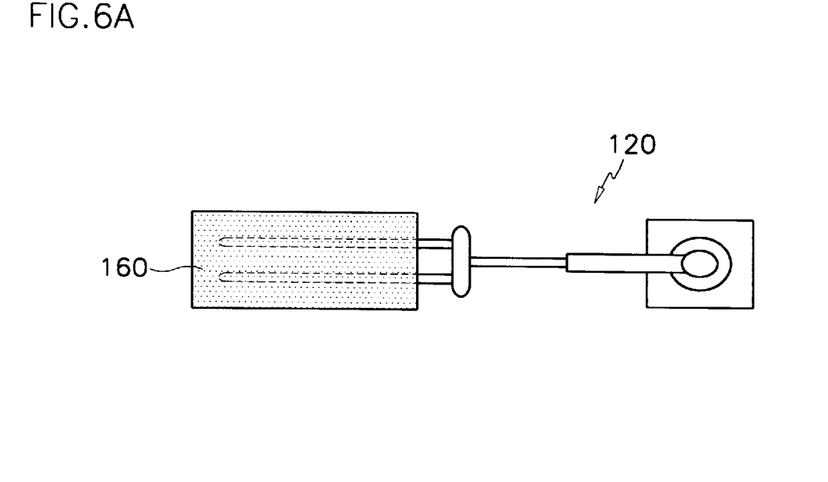
FIGS. 6(a) through (c) show moving status of a conveying robot for an uncut master substrate, a ½ cut master substrate, and a ⅓ cut master substrate, respectively.
Figure 6B:
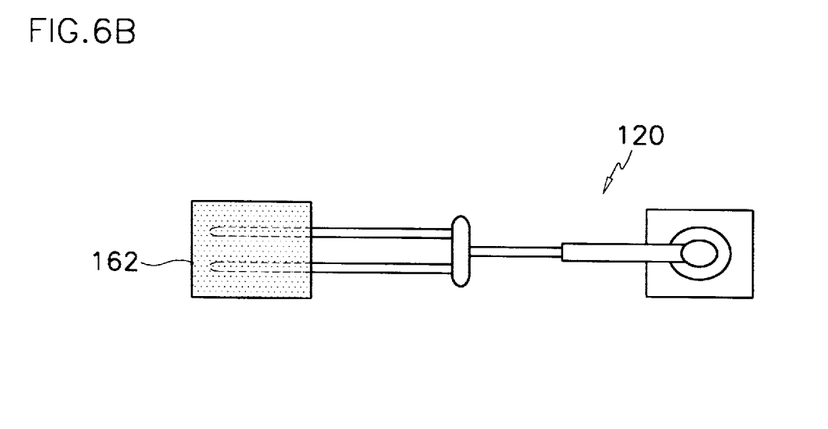
Figure 6C:
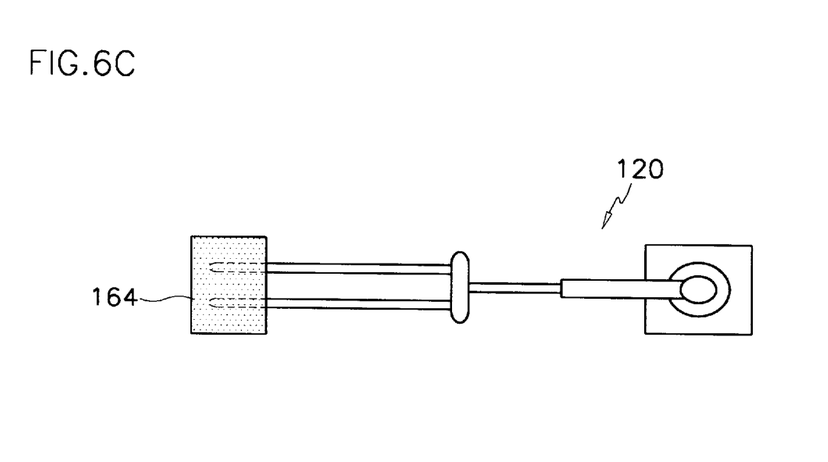

After the substrate is arranged along the rear of the handling station 110, the conveying robot 120 lifts the substrates 160, 162, and 164 as shown in FIGS. 6(a) through (c), respectively. At this time, since the master substrates 160, 162, and 164 are arranged to the rear of the handling station 110 in the second embodiment of the present invention, the conveying robot 120 lifts and transfers the master substrates 160, 162, and 164 without changing its length (as in the first embodiment). Accordingly, all the substrates 160, 162, and 164 are positioned to the end of the cassette 170 or the subsequent process apparatus 170 farthest from the conveying robot 120, thereby ensuring the secure loading of the cut substrates 162 and 164.

A method for unloading a master substrate according to a third embodiment of the present invention will be described hereinafter with reference to FIGS. 7(a) through (f).

Figure 7A:
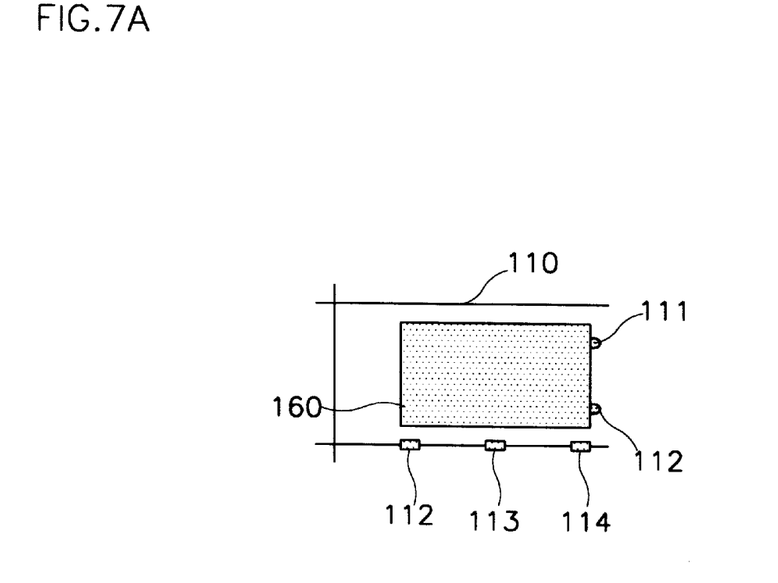
Figure 7B:
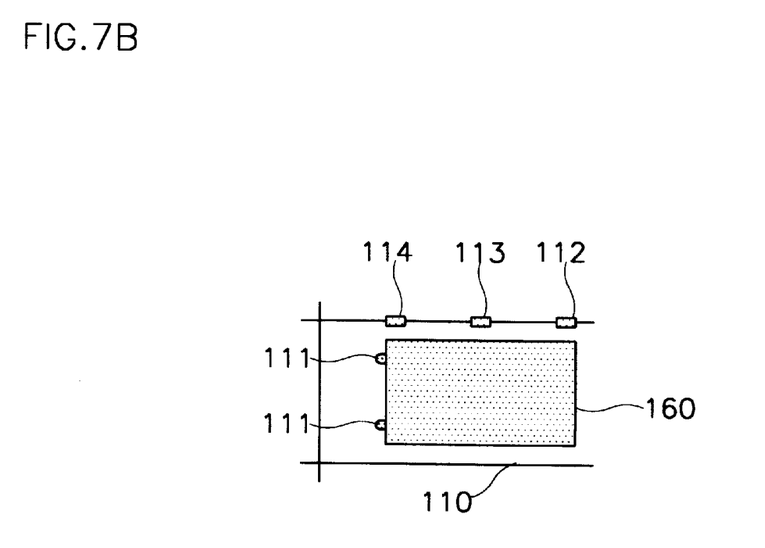
Figure 7C:
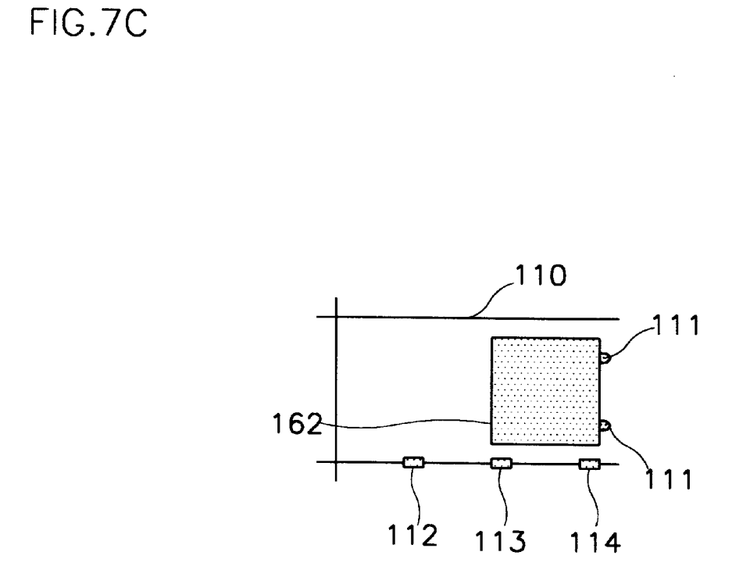
Figure 7D:
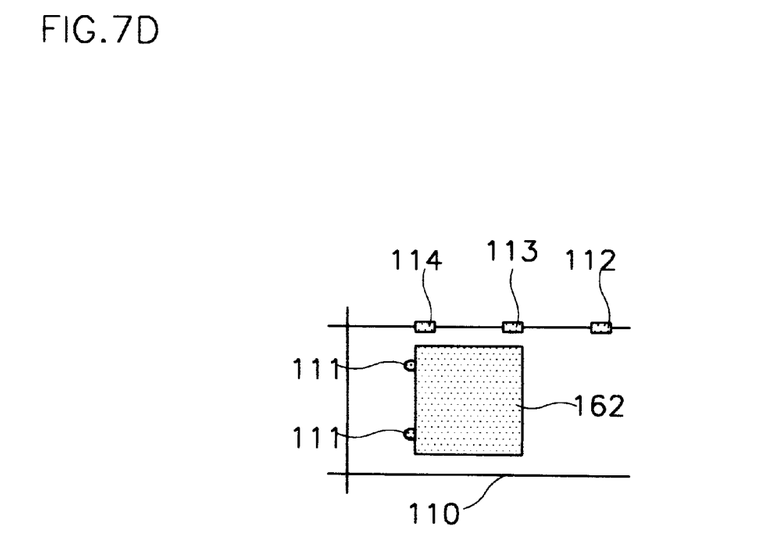
Figure 7E:
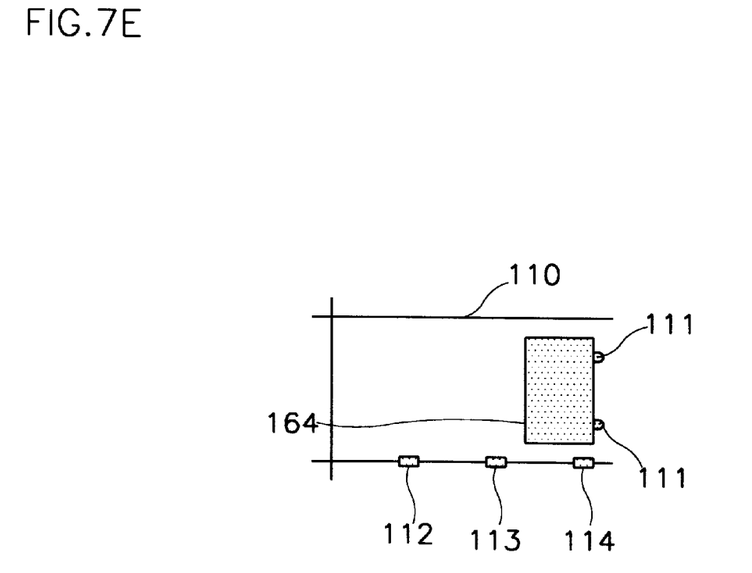
Figure 7F:
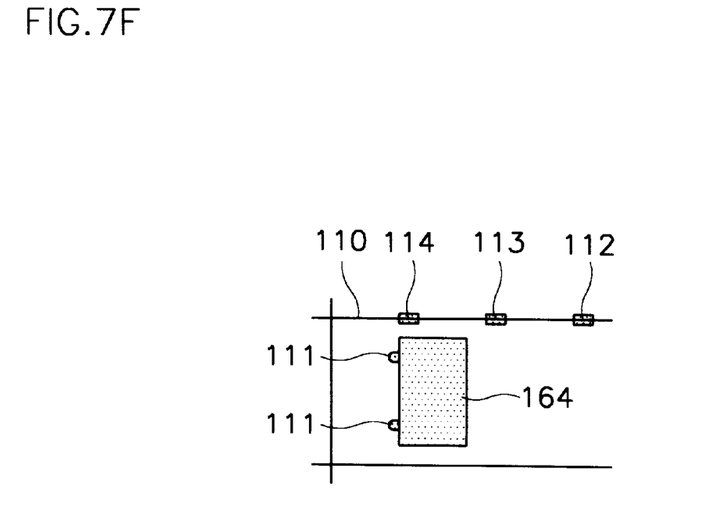

According to the third embodiment of the present invention, the master substrates 160, 162, and 164 are arranged toward the front handling station 110 by the stop bars 111 regardless of size as shown respectively in FIGS. 7(a), (c), and (e). After the master substrates 160, 162, and 164 are arranged on the handling station 110, the handling station 110 rotates 180°. Accordingly, the front of the handling station 110 becomes the rear of the handling station 110. After this operation, although the uncut master substrate 160 makes no difference in position on the handling station 110 as shown in FIG. 7(b), the cut master substrates 162 and 164 are arranged along the rear of the handling station 110 as shown in FIGS. 7(d) and (f). At this time, either the entire handling station 110 or only a part of the handling station 110 where the substrate is placed is rotated 180°.

With the master substrates 160, 162, and 164 arranged along the rear of the handling station 110, the conveying robot 120 lifts and transfers the master substrates 160, 162, and 164 to the cassette or the subsequent process apparatus, thereby ensuring that the cut master substrates 162 and 164 are loaded on a secure position.

In the third embodiment of the present invention, since the handling station 110 rotates 180° for all the master substrates 160, 162, and 164, there is no need for the handling station 110 to detect substrate size, or for the process apparatus controller 130 to receive information on the substrate size.

Figure 8:
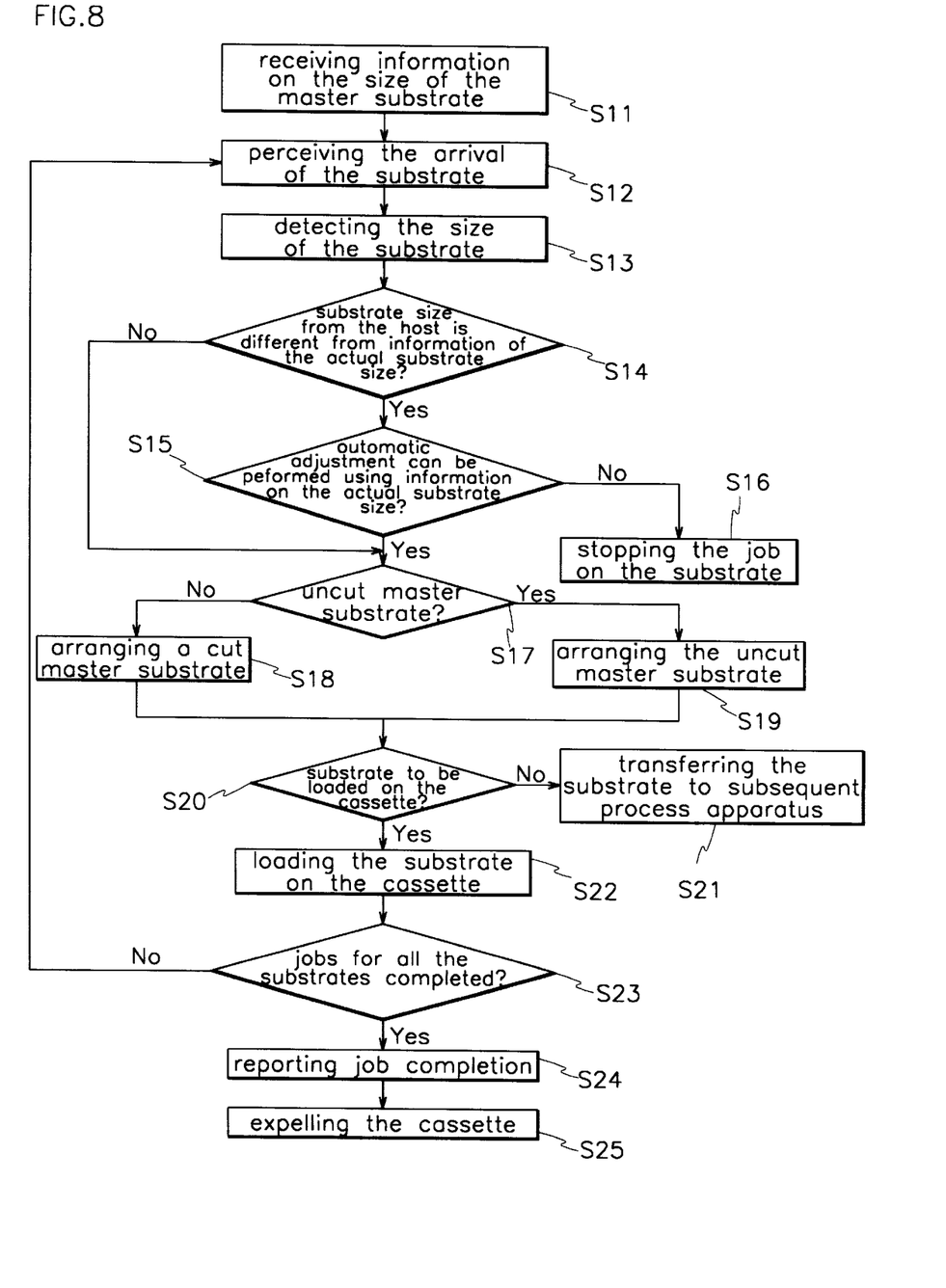
FIG. 8 is a flow chart showing an entire operation of the unloading device of FIG. 2.

The entire operation of the unloading device according to an embodiment of the present invention will now be described with reference to FIG. 8.

The process apparatus controller 130 receives information on the size of the master substrate 160, 162, or 164 to be transferred to the handling station 110. The information may come from the prior process apparatus or from the host 200, or from the operator interface 140 (Step S11). When the substrate 160, 162, or 164 arrives from the prior process apparatus (Step S12), the position detecting sensors 112, 113, and 114 of the handling station 110 detects the size of the master substrate 160, 162, and 164 and transfers information on the substrate size to the process apparatus controller 130 (Step S13).

The process apparatus controller 130 then determines whether information on the substrate size received from the host 200 (or the prior process apparatus or manual input by the operator) corresponds to information on substrate size that the handling station 110 detected (Step S14).

In the Step S14, if the received information on substrate size is different from the information on substrate size detected by the handling station 110, a decision is made whether jobs can be processed based upon the detected information on the substrate size (Step S15).

At this time, the decision whether or not jobs can be processed based upon the detected information on the substrate size is made, depending on the risks involved in the jobs.

In the Step S15, if it is determined that the jobs cannot be processed because of the risk, the process apparatus controller 130 stops the jobs on the substrate 160, and waits for instructions from the operator (Step S16). If it is determined that the jobs can be processed, the jobs are processed according to the information on the substrate 160, 162, or 164 detected by the handling station 110, and the information on the substrate size is transferred to the host 200 or the subsequent process apparatus.

If it is determined that substrate size information transferred from the host 200 corresponds to the actual substrate size in the step S14, or it is determined that the jobs are processed according to the information on the actual size of the substrate in the step S15, the process apparatus controller 130 determines whether or not the master substrate 160, 162, or 164 is the uncut master substrate 160 or the cut master substrate 162 or 164 (Step S17).

Based on the results of the step S17, each of the cut master substrate 162 or 164 or the uncut master substrate 160 is arranged according to one of the methods of the present invention as described above (Step S18 and Step S19).

When the master substrate 160, 162, or 164 is arranged completely, the process apparatus controller determines whether these master substrates 160, 162, or 164 will be loaded on the cassette or on subsequent process apparatus (Step S20).

In the step S20, if it is determined that the master substrate 160, 162, or 164 will be loaded on the subsequent process apparatus, the conveying robot 120 transfers the substrate 160, 162, or 164 to a secure position of the subsequent process apparatus. At this time, the process apparatus controller 130 simultaneously transfers information on the substrate size (Step S21).

In the step S20, if it is determined that the substrate 160, 162, or 164 will be loaded on the cassette, the conveying robot 120 transfers the substrate 160, 162, or 164 to a secure position of the cassette (Step S22), and determines whether or not the jobs for all the substrate 160, 162, or 164 on the cassette have been processed (Step S23).

If the jobs of the substrates 160, 162, or 164 loaded on the cassette are completed, the process apparatus controller 130 reports that the jobs are completed to the host 200 (Step S24), and then expels the cassette (Step S25).

As described above, in the embodiments of the present invention, since the positions of the handling station on which the master substrate is placed are adjusted according to the substrate size, or the master substrate is loaded on the cassette or the subsequent process apparatus by adjusting the rotation arc of the conveying robot, the master substrate can be loaded on a secure position of the cassette or subsequent process apparatus. This can protect the master substrate from the damage that may be caused by vibrations or external shocks, regardless of whether the substrate is an uncut master substrate or a cut master substrate.

While this invention has been described in connection with what is presently considered to be the most practical and preferred embodiment, it is to be understood that the invention is not limited to the disclosed embodiments, but, on the contrary, is intended to cover various modifications and equivalent arrangements included within the spirit and scope of the appended claims.

What is claimed is:

1. An apparatus for unloading a substrate, comprising:
    a handling station arranging substrates of various sizes processed in a prior process apparatus;
    a conveying robot lifting the substrate arranged on the handling station and loading the substrate to a predetermined position on a cassette or a subsequent process apparatus according to the various sizes of the substrate; and
    a process apparatus controller controlling the arrangement of the substrate on the handling station or motions of the conveying robot in order to load the substrate on a predetermined position of the cassette or the subsequent process apparatus according to the various sizes of the substrate.

2. The apparatus of claim 1, wherein the handling station comprises a stop bar that stops the substrate when provided from the prior process apparatus.

3. The apparatus of claim 2, wherein the stop bars are formed on a front end of the handling station regardless of the size of the substrate.

4. The apparatus of claim 3, wherein the handling station further comprises a detecting sensor to detect the size of the substrate arranged by the stop bars.

5. The apparatus of claim 4, wherein information on the size of the substrate detected by the sensor is transferred to the process apparatus controller, and the process apparatus controller controls a rotation arc of the conveying robot using the information on the size of the substrate to load the substrate on a secure position of the cassette or the subsequent process apparatus.

6. The apparatus of claim 5, wherein the conveying robot further comprises:
    a base;
    a rotating shaft rotatably mounted on the base;
    a rotating arm coupled to the rotating shaft and rotating together with the rotating shaft;
    a sliding arm slidably coupled to the rotating arm; and
    a conveying chuck coupled to the sliding arm and having a vacuum plate for detachably fixing the substrate on the conveying chuck.

7. The apparatus of claim 6, wherein if the substrate is an uncut substrate, the conveying robot with said sliding arm of a first length d1 lifts the uncut substrate using the conveying chuck and loads the uncut substrate on the cassette or the subsequent process apparatus by rotating said rotating arm, and
    wherein if the substrate is a cut substrate, the conveying robot with said sliding arm of a second length d2 lifts the cut substrate using the conveying chuck, and loads the cut substrate on the cassette or the subsequent process apparatus after stretching the sliding arm outward from within the rotating arm to restore its length back to the first length d1.

8. A method for unloading substrates in a system including a handling station having a position detect sensor, a conveying robot with a sliding arm and a process apparatus controller, comprising the steps of:
    arranging a substrate to a front end of a handling station;
    measuring size of the substrates using the position detector sensor;
    transferring information on the size of the arranged substrates to the process apparatus controller; and controlling a rotational arc of the conveying robot that transfers the substrate according to the information on the size of the transferred substrate, and loading the substrate to a position of a cassette or a subsequent process apparatus.

9. The method of claim 8, wherein if the substrate is an uncut substrate, the conveying robot lifts the uncut substrate with the sliding arm of a first length d1, and moves the substrate to the cassette or the subsequent process apparatus, and wherein if the substrate is a cut substrate, the conveying robot lifts the cut substrate with the sliding arm of a decreased second length d2, and moves the substrate to the cassette or the subsequent process apparatus, after stretching the slide arm outward to the first length d1.

10. The method of claim 9, wherein the process apparatus controller controls the rotational arc of the conveying robot according to the substrate size measured by the position detecting sensor.

11. The method of claim 9, wherein the process apparatus controller receives the information on the size of the substrate arranged on the handling station from a host, a prior process apparatus, or an operator interface, and controls the rotational arc of the conveying robot.

12. The method of claim 9, wherein the process apparatus controller receives the information on the size of the substrate from the position detecting sensors mounted on the handling station and from a host, and determines whether the size of the substrate detected by the position detecting sensors corresponds to the size of the substrate received from the host, wherein the process apparatus controller stops unloading the substrate when the information on the size of the substrate detected by the position detecting sensors is different from the information on the size of the substrate received from the host, and wherein the process apparatus controller controls the rotational arc of the conveying robot according to the size of the substrate detected by the position detecting sensors when the information on the size of the substrate detected by the position detecting sensors is different from the information on the size of the substrate received from the host.

* * * * *